United States Patent
Hsu

(10) Patent No.: US 7,040,815 B2
(45) Date of Patent: May 9, 2006

(54) MODULARIZED ELECTRONIC DEVICE OPERATING STATUS DISPLAY ARCHITECTURE

(75) Inventor: Cheng-Chung Hsu, Taipei (TW)

(73) Assignee: Inventec Corporation, Taipei (TW)

( * ) Notice: Subject to any disclaimer, the term of this patent is extended or adjusted under 35 U.S.C. 154(b) by 256 days.

(21) Appl. No.: 10/704,054

(22) Filed: Nov. 7, 2003

(65) Prior Publication Data

US 2005/0100287 A1    May 12, 2005

(51) Int. Cl.
G02B 6/00      (2006.01)
G02B 6/36      (2006.01)

(52) U.S. Cl. .......................... 385/88; 385/92; 385/134
(58) Field of Classification Search .................. 385/88, 385/92, 134
See application file for complete search history.

(56) References Cited

U.S. PATENT DOCUMENTS 4,517,880 A * 5/1985 Buckner et al. ............ 454/184
5,157,512 A * 10/1992 Inada et al. ................. 386/118

* cited by examiner

Primary Examiner—Akm Enayet Ullah
Assistant Examiner—Daniel Petkovsek
(74) Attorney, Agent, or Firm—Fulbright & Jaworski LLP

(57) ABSTRACT

A modularized electronic device operating status display architecture is proposed, which is designed for use with a modularized electronic device mounted on the inside of a chassis of an electronic system, and which is capable of detecting whether the modularized electronic device operates normally during operation to thereby display its operating status as light signals on the outside of the chassis to allow assembly personnel or user to learn the operating status by visually checking the externally-displayed light signals. The proposed modularized electronic device operating status display architecture is more advantageous to use in that it allows the assembly to be less complex in structure and more increased in productivity. Furthermore, it allows no removal and reconnection of electrical wires during the replacement of a faulted modularized device. This feature allows both assembly and maintenance of the modularized fan unit to be more convenient and efficient than prior art.

6 Claims, 4 Drawing Sheets

MODULARIZED ELECTRONIC DEVICE OPERATING STATUS DISPLAY ARCHITECTURE

BACKGROUND OF THE INVENTION

1. Field of the Invention

This invention relates to electronic system assembly technology, and more particularly, to a modularized electronic device operating status display architecture which is designed for use with a modularized electronic device, such as a modularized fan unit, that is to be mounted on the inside of a chassis of an electronic system, such as a Web server or a desktop computer, and which is capable of detecting whether the modularized electronic device operates normally when the modularized electronic device is mounted in position in the chassis and displaying the operating status of the modularized electronic device as light signals on the outside of the chassis so as to allow assembly personnel or user to learn the operating status of the modularized electronic device by visually checking the externally-displayed light signals.

2. Description of Related Art

Electronic systems typically produce large amounts of heat due to consumption of electrical power during operation, and if this heat is undissipated, it would result in burnout of electrical components or chips, thus causing the electronic system to shut down or fail to operate normally. One solution to this problem is to provide heat-dissipating devices, such as electrical fans, to dissipate heat in the electronic system during operation. For example, network servers or desktop computers are customarily mounted with one or more modularized fan units in the chassis for producing a flow of air to blow away heat in the electronic system during operation.

In practice, a modularized fan unit is customarily assembled with an operating status display unit on a circuit card for the purpose of indicating the operating status of the modularized fan unit during operation. For example, it a modularized fan unit operates normally, the operating status display unit will emit a beam of green light; whereas it the modularized fan unit operates abnormally, the operating status display unit will emit a beam of red light.

One drawback to conventional operating status display unit for modularized fan unit, however, is that the operating status detecting circuitry is typically located on the inside of the chassis, and therefore it requires the routing of electrical wires from the internal circuit card to the outside of the chassis so as to connect the operating status detecting circuitry to light-emitting diodes mounted on the outside of the chassis for the purpose of allowing assembly personnel or users to learn the current operating status of the modularized fan unit during operation by visually checking the light signal from the externally-mounted light-emitting diodes. This practice would undoubtedly make the assembly of modularized fan unit to be more complex in structure and thus low in productivity.

SUMMARY OF THE INVENTION

It is therefore an objective of this invention to provide a modularized electronic device operating status display architecture which allows the assembly of the modularized fan unit with the chassis to be more simplified in structure to help increase productivity in the assembly of electronic systems.

The modularized electronic device operating status display architecture according to the invention is designed for use with a modularized electronic device, such as a modularized fan unit, that is to be mounted on the inside of a chassis of an electronic system, such as a Web server or a desktop computer, and which is capable of detecting whether the modularized electronic device operates normally when the modularized electronic device is mounted in position in the chassis and displaying the operating status of the modularized electronic device as light signals on the outside of the chassis so as to allow assembly personnel or user to learn the operating status of the modularized electronic device by visually checking the externally-displayed light signals.

The modularized electronic device operating status display architecture according to the invention is characterized by the use of a light-guiding pipe to guide the light signal emitted from an operating status detecting module, which is located on the inside of the chassis, to the outside of the chassis, allowing the assembly personnel or user on the outside of the chassis to see the emitted light signal from the light-generating module to thereby learn the current operating status of the modularized fan unit during operation.

Compared to prior art, since the invention can be implemented without having to mount the light-emitting diode on the outside of the chassis and use electrical wires to connect the light-emitting diode to the internally-located circuit card, it allows the assembly of the modularized fan unit to be less complex in structure and thus more increased in productivity. Furthermore, the invention allows maintenance personnel to conveniently remove a faulted modularized fan unit when seeing a fault-indicative light signal emitted from the modularized electronic device operating status display architecture of the invention, without having to first remove electrical wires on the modularized fan unit for removal of the modularized fan unit and then reconnect electrical wires after a new modularized fan unit is mounted in position, as in the case of prior art. This feature allows both assembly and maintenance of the modularized fan unit to be more convenient and efficient than prior art.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

A preferred embodiment of the modularized electronic device operating status display architecture according to the invention is disclosed in full details in the following with reference to the accompanying drawings.

Figure 1:
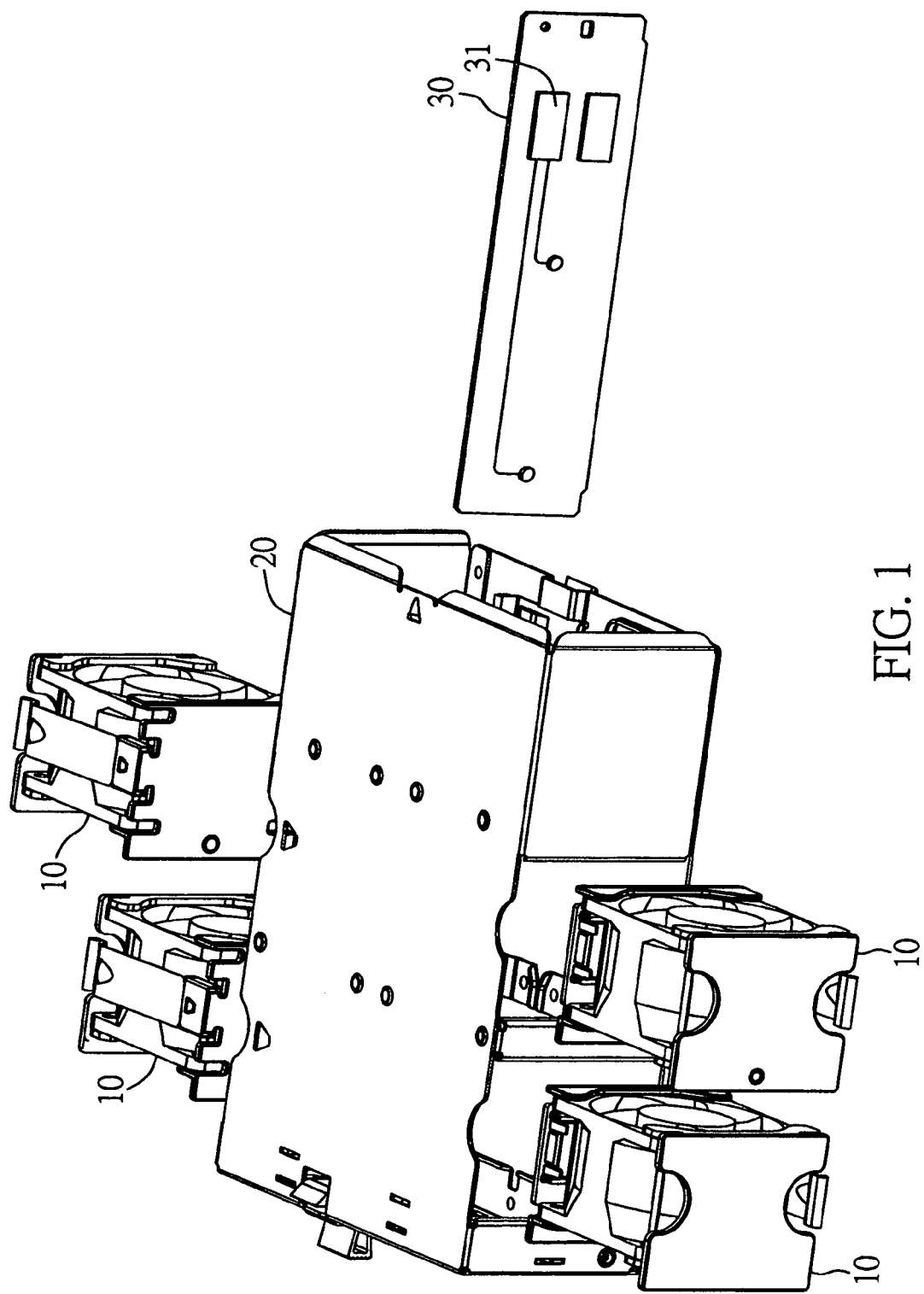
FIG. 1 is a schematic diagram showing an exploded perspective view of a chassis that is to be mounted with a number of modularized fan units and a circuit card on which the modularized electronic device operating status display architecture of the invention is utilized.
Figure 2:
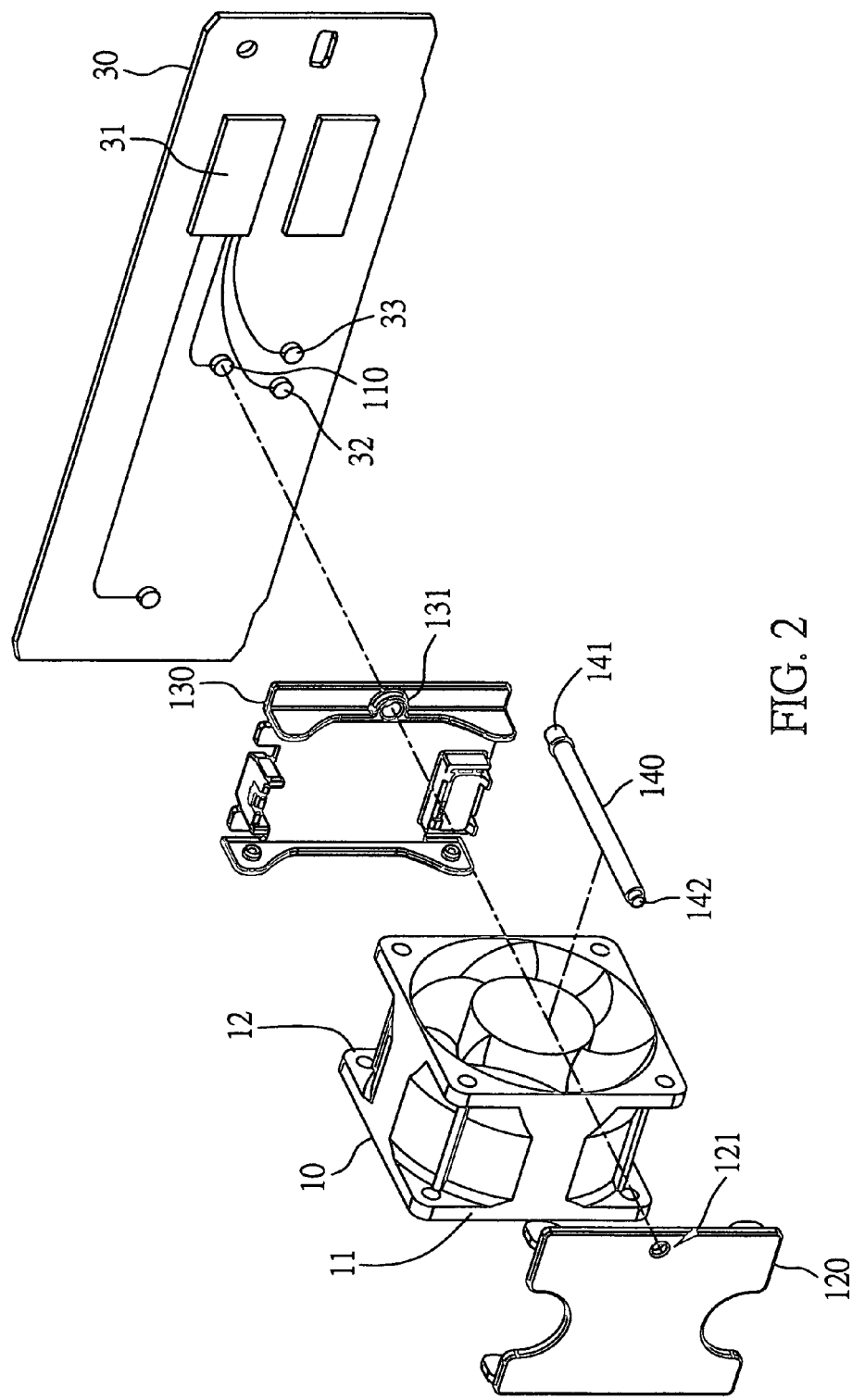
FIG. 2 is a schematic diagram showing an exploded perspective view of the modularized electronic device operating status display architecture of the invention before being assembled to a modularized fan unit.

As shown in FIG. 1, the modularized electronic device operating status display architecture of the invention is designed for use in conjunction with one or more modularized electronic devices, such as modularized fan units 10, that are to be mounted to the inside of a chassis 20 of an electronic system, such as a network server or a desktop computer, and wherein the chassis 20 is further mounted with a circuit card 30 which is provided with an operating status detecting module 31, a plurality of signal contact points 32, and a plurality of power contact points 33 (shown in FIG. 2). When each modularized fan unit 10 in mounted in position on the inside of the chassis 20, the power contact points 33 will come in contact with corresponding power contact points (not shown) on the modularized fan unit 10 so as to supply power via the power contact points 33 to the modularized fan unit 10, and as well the signal contact points 32 will come in contact with corresponding signal contact points (not shown) on the modularized fan unit 10 to allow the operating status detecting module 31 to be functionally connected to the modularized fan unit 10 to detect the operating status of the modularized fan unit 10 during operation. The operating status detecting module 31 utilizes a conventional technique to detect whether the modularized fan unit 10 operate normally or abnormally, so detailed description thereof will not be given in this specification.

FIG. 2 is a schematic diagram showing an exploded perspective view of the modularized electronic device operating status display architecture of the invention before being assembled to the modularized fan unit 10. As shown, the modularized electronic device operating status display architecture of the invention, beside the above-mentioned operating status detecting module 31, further comprises: (a) a light-generating module 110; (b) a first supportive plate 120; (c) a second supportive plate 130; and (d) a light-guiding pipe 140.

The light-generating module 110 is, for instance, a light-emitting diode, which is mounted at a predefined position on the circuit card 30, and which is capable of being activated by the operating status detecting module 31 to emit a beam of light indicative of whether the modularized fan unit 10 operates normally when the modularized fan unit 10 is mounted in position on the inside of the chassis 20. For example, if the modularized fan unit 10 operates normally, the operating status detecting module 31 will activate the light-generating module 110 to emit a beam of green light; whereas, if the modularized fan unit 10 operates abnormally, the operating status detecting module 31 will activate the light-generating module 110 to emit a beam of red light.

The first supportive plate 120 is formed with a light-passing hole 121 on one edge thereof, and which is used for attachment to the external side 11 of the modularized fan unit 10 (i.e., the side that is exposed to the outside of the chassis 20 when the modularized fan unit 10 is mounted in position on the inside of the chassis 20).

The second supportive plate 130 is likewise formed with a light-passing hole 131, and which is used for attachment to the internal side 12 of the modularized fan unit 10 (i.e., the side that is internally hidden on the inside of the chassis 20 when the modularized fan unit 10 is mounted in position on the inside of the chassis 20). When the first supportive plate 120 is attached in position on the modularized fan unit 10, the light-passing hole 131 is aligned to the light-generating module 110 so as to be able to receive the emitted light signal from the light-generating module 110.

The light-guiding pipe 140 is an elongated light-guiding means, such as an optical fiber, which has an input end 141 and an output end 142, and which is capable of guiding a light beam therethrough from the input end 141 to the output end 142 to allow the guided light beam to be emitted from the output end 142.

Figure 3:
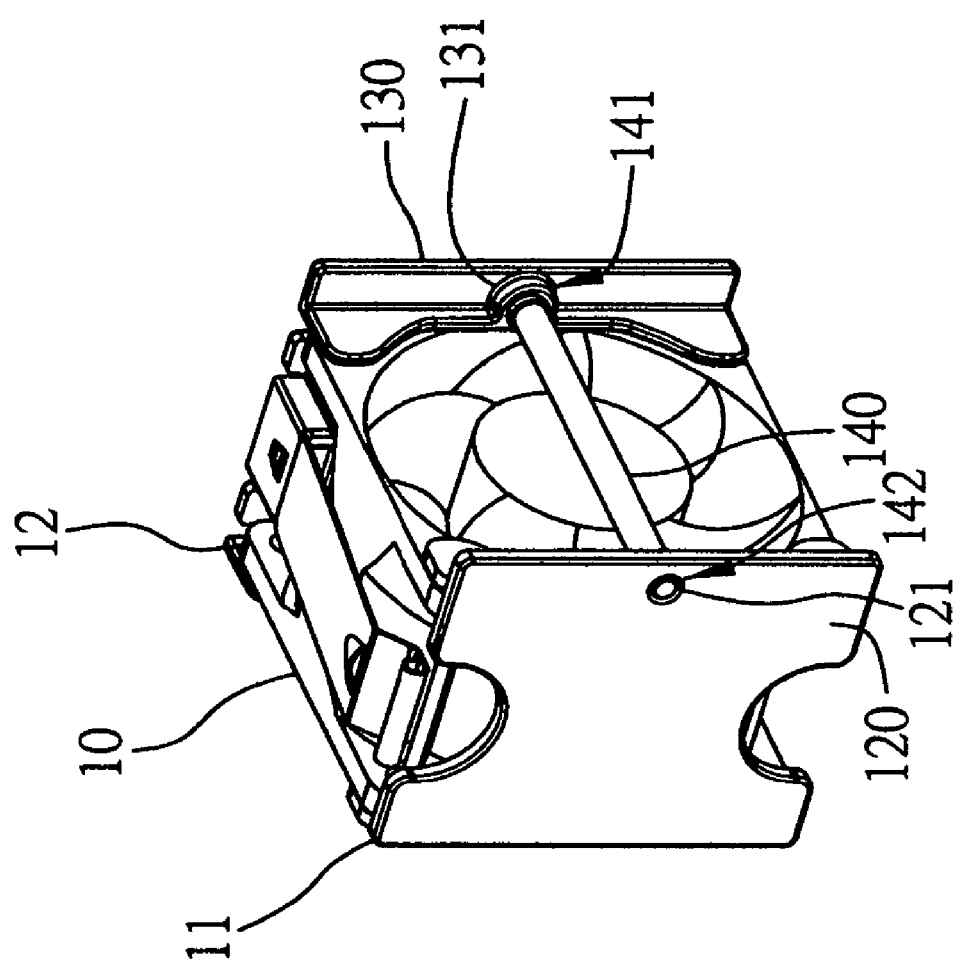
FIG. 3 is a schematic diagram showing a perspective view of the attachment of a light-guiding pipe to a modularized fan unit.

Referring to FIG. 3, during the assembly process, the first step is to assemble the first supportive plate 120, the second supportive plate 130, and the light-guiding pipe 140 with the modularized fan unit 10, in such a manner that the first supportive plate 120 is fixedly attached to the external side 11 of the modularized fan unit 10; the second supportive plate 130 is fixedly attached to the internal side 12 of the modularized fan unit 10; and the light-guiding pipe 140 has its input end 141 coupled to the light-passing hole 131 in the second supportive plate 130 and its output end 142 coupled to the light-passing hole 121 in the first supportive plate 120.

Referring to the previous FIG. 1, as the modularized fan unit 10 is assembled with the first supportive plate 120, the second supportive plate 130, and the light-guiding pipe 140, it is then mounted along with the circuit card 30 to the inside of the chassis 20. In the embodiment of FIG. 1, for example, a total of 4 modularized fan units 10 are mounted to the chassis 20; however, the number of modularized fan units mounted to the inside of the chassis 20 is an arbitrary choice, and can be 1, 2, 3, 5, or more.

Figure 4:
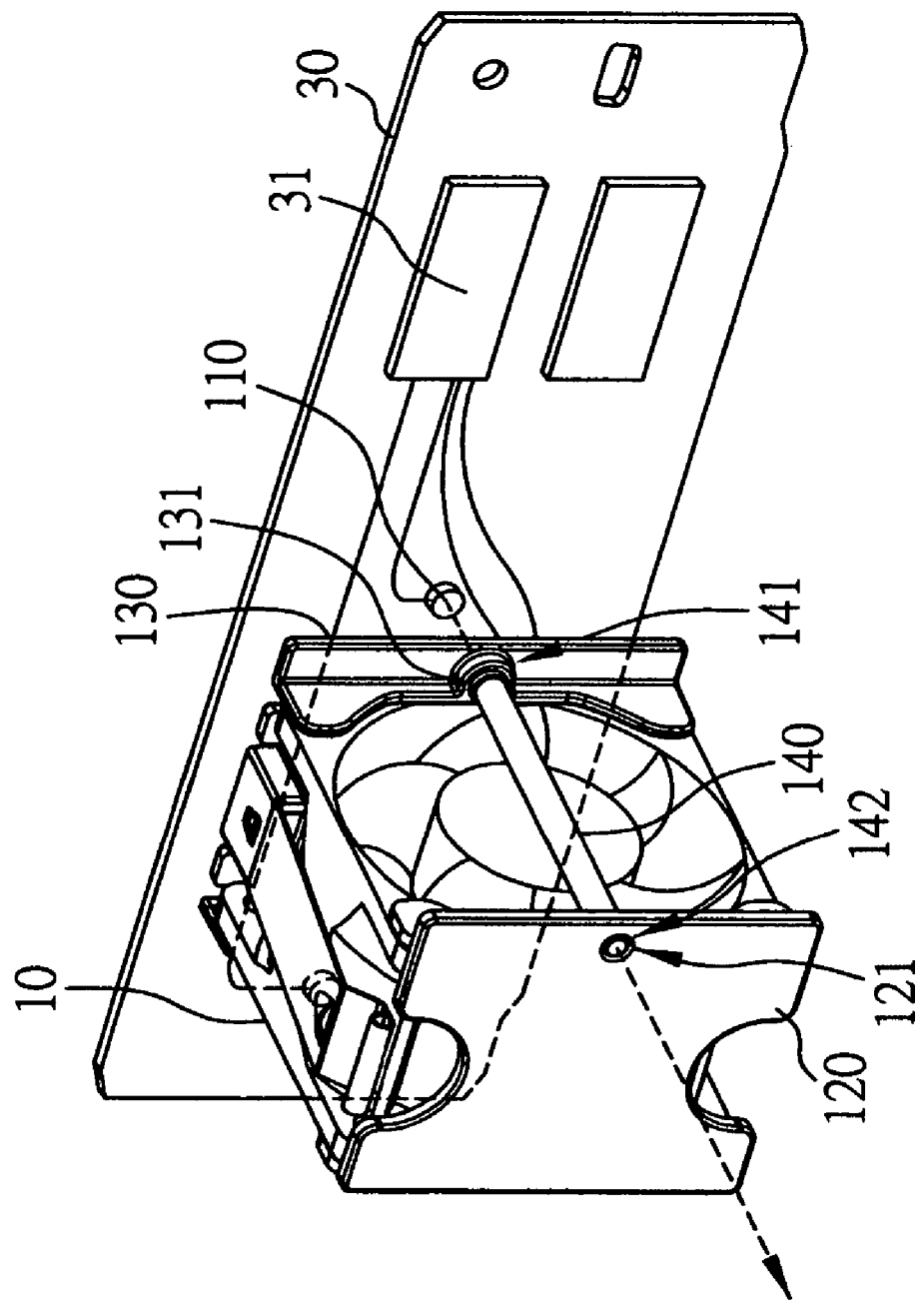
FIG. 4 is a schematic diagram showing a perspective view of the coupling of the modularized electronic device operating status display architecture of the invention to a modularized fan unit and a circuit card mounted on the inside of a chassis.

FIG. 4 is a schematic diagram showing a perspective view of the coupling of each modularized fan unit 10 with the circuit card 30 when both are mounted in position on the inside of the chassis 20. As shown, when the modularized fan unit 10 and the circuit card 30 are mounted in position on the inside of the chassis 20, the light-passing hole 131 in the second supportive plate 130 is aligned to the light-generating module 110 on the circuit card 30, thus allowing the input end 141 of the light-guiding pipe 140 to be optically coupled to the light-generating module 110. During actual operation, the light signal emitted from the light-generating module 110 will be received by the input end 141 of the light-guiding pipe 140, and subsequently guided through the light-guiding pipe 140 to be outputted from the output end 142 of the light-guiding pipe 140. As a result, it allows assembly personnel or user on the outside of the chassis 20 to learn the current operating status of the modularized fan unit 10 during operation by visually checking the emitted light signal from the output end 142 of the light-guiding pipe 140 received from the light-generating module 110.

In conclusion, the invention provides a modularized electronic device operating status display architecture which is designed for use with a modularized electronic device, such as a modularized fan unit, that is mounted to the chassis of an electronic system, and which is capable of detecting whether the modularized electronic device operates normally when the modularized electronic device is mounted in position in the chassis to thereby display the operating status of the modularized electronic device as light signals on the outside of the chassis so as to allow assembly personnel or the user to learn the operating status of the modularized electronic device. The modularized electronic device operating status display architecture of the invention is characterized by the use of a light-guiding pipe to guide the light signal emitted from an operating status detecting module located on the inside of the chassis to the outside of the chassis, allowing the assembly personnel or user on the outside of the chassis to learn the current operating status of the modularized fan unit during operation by visually checking the emitted light signal from the output end of the light-guiding pipe received from the light-generating module. Compared to prior art, since the invention can be implemented without having to mount the light-emitting diode on the outside of the chassis and use electrical wires to connect the light-emitting diode to the internally-located circuit card, it allows the assembly of the modularized fan unit to be less complex in structure and thus more increased in productivity. Furthermore, the invention allows maintenance personnel to conveniently remove a faulted modularized fan unit when seeing a fault-indicative light signal emitted from the modularized electronic device operating status display architecture of the invention, without having to first remove electrical wires on the modularized fan unit for removal of the modularized fan unit and then reconnect electrical wires after a new modularized fan unit is mounted in position, as in the case of prior art. This feature allows both assembly and maintenance of the modularized fan unit to be more convenient and efficient than prior art. The invention is therefore more advantageous to use than the prior art.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A modularized electronic device operating status display architecture for use with a modularized electronic device mounted to the inside of a chassis of an electronic system, for the purpose of detecting whether the modularized electronic device operates normally when the modularized electronic device is mounted in position in the chassis to thereby display the operating status of the modularized electronic device as light signals on the outside of the chassis to indicate the operating status of the modularized electronic device;

the modularized electronic device operating status display architecture comprising:
a circuit card;
an operating status detecting module, which is installed on the circuit card and capable of being activated to detect whether the modularized electronic device operates normally when the modularized electronic device is mounted in position in the chassis;
a plurality of signal contact points installed on the circuit card and electrically connected to the operating status detecting module for contacting with corresponding signal contact points on the modularized electronic module to allow the operating status detecting module to be functionally connected to the modularized electronic device to detect the operating status of the modularized electronic device during operation;
a light-generating module, which is capable of being activated by the operating status detecting module to emit a beam of light indicative of the current operating status of the modularized electronic device;
a first supportive plate, which is formed with a light-passing hole, and which is attached to the external side of the modularized electronic device;
a second supportive plate, which is formed with a light-passing hole, and which is attached to the internal side of the modularized electronic device in such a manner as to allow the light-passing hole thereof to be align to the light-generating module to receive the light beam emitted from the light-generating module; and
a light-guiding pipe, which has an input end and an output end, and wherein the input end is optically coupled to the light-passing hole in the second supportive plate while the output end is coupled to the light-passing hole in the first supportive plate, and which is capable of guiding the light beam received via the input end from the light-generating module to the output end thereof to allow the guided light beam to be emitted from the output end thereof.

2. The modularized electronic device operating status display architecture of claim 1, wherein the modularized electronic device is a modularized fan unit.

3. The modularized electronic device operating status display architecture of claim 1, wherein the chassis is a Web server's chassis.

4. The modularized electronic device operating status display architecture of claim 1, wherein the chassis is a desktop computer's chassis.

5. The modularized electronic device operating status display architecture of claim 1, wherein the light-generating module is a light-emitting diode.

6. The modularized electronic device operating status display architecture of claim 1, wherein the light-guiding pipe is an optical fiber.

* * * * *